United States Patent [19]

Dascher

[11] Patent Number: 5,583,447

[45] Date of Patent: Dec. 10, 1996

[54] VOLTAGE PROBE WITH REVERSE IMPEDANCE MATCHING

[75] Inventor: David J. Dascher, Colorado Springs, Colo.

[73] Assignee: Hewlett-Packard Company, Palo Alto, Calif.

[21] Appl. No.: 383,803

[22] Filed: Feb. 3, 1995

[51] Int. Cl.⁶ .................................................. G01R 31/28
[52] U.S. Cl. .......................................... 324/754; 324/614
[58] Field of Search .................................. 324/763, 764, 324/754, 614, 620, 628

[56] References Cited

U.S. PATENT DOCUMENTS 5,418,470   5/1985   Dagostino et al. ................... 324/763

OTHER PUBLICATIONS

Kurpis, New IEEE Standard Dictionary of Electrical and Electronics Terms, IEEE Inc., Fifth Ed., p. 921.

Primary Examiner—Kenneth A. Wieder
Assistant Examiner—Barry C. Bowser

[57] ABSTRACT

An analog test probe includes an integrated circuit having a large number of separate channels, each connected to one of its inputs. There is a plurality of probe tips and 100 ohm coaxial cables, each cable connecting one of said probe tips and one of the IC inputs. This structure introduces reverse signals into the channels that would seriously degrade probe operation if not removed. A capacitor and resistor in each probe tip, and in series with the coaxial cable and ground, match the impedance of the coaxial cable in the reverse direction, so that reverse signals are dissipated in the resistance and capacitance and do not reflect into the probe channels.

20 Claims, 3 Drawing Sheets

VOLTAGE PROBE WITH REVERSE IMPEDANCE MATCHING

BACKGROUND OF THE INVENTION

1. Field of the Invention

The invention in general relates to voltage probes that pass a test signal from an electronic circuit element to be tested to an oscilloscope or other electronic measurement device, and more particularly to a probe system that incorporates many individual probe channels in a small package, yet passes the test signal with high signal integrity over a high band width.

2. Statement of the Problem

Voltage probes are commonly used to pass analog test signals from a circuit under test to an oscilloscope or other electrical or electronic test instrument. Such an electronic probe must be capable of passing an electrical signal on a node or pin of the circuit under test to the test instrument without distorting it, i.e. with high signal integrity. Further, it should not apply any voltage or current to the circuit under test.

Present-day electronic circuits operate over frequencies from DC to several gigahertz. Thus, test probes capable of being used with a wide variety of circuits must be able to provide high signal integrity over a wide band width of frequencies.

The art of test probes that pass analog signals to a test instrument should be distinguished from the digital test equipment art. In the latter art high signal integrity is not a significant goal, since digital test instruments only need to detect the rise or fall of a digital signal.

Integrated and hybrid circuits are becoming both more complex and smaller, leading to ever higher numbers of package leads crowded into less and less space, that is, the leads are becoming extremely dense with very tight pitches. To deal with such a high number of leads, one solution, which is the subject of copending United States Patent application Serial No. (PDN 1094751), is to use a high number of multiplexed probe channels, each of which can probe a different lead of the circuit under test. The probes should be small so that many of them can be used on the same device under test. In a multiplexed probe system, all of the probe channels must come into close proximity in the multiplexer. This physical closeness leads to coupling between the probes. That is, some of the signal on one probe channel couples to adjacent probe channels. We have found that this coupling is particularly severe in the reverse direction at high frequencies. This is unacceptable, since the basic requirement of an analog probe is to pass the signal from the circuit under under test to the test instrument essentially unchanged, except for amplitude. Further, there will necessarily be some input capacitance in the probe amplifier circuit. Any input capacitance in the probe amplifier will cause reflections back up the input cable. Thus, the reverse coupling between adjacent probes that are physically close together and the signal reflection due to input capacitance of a probe amplifier, both produce reverse signals that propagate back up the input cable. In conventional probes, when the reverse signal reaches the probe tip it is re-reflected back down the cable and then appears at the amplifier input as an error which is a degradation to the probes accuracy and performance.

SUMMARY OF THE INVENTION

The present invention solves the above problems by providing a probe system with a high density of separate probe channels. The probe system includes a multiplicity of probe tips, each tip connected via a separate coaxial cable to a single, hand-held probe body. Reverse signals are practically eliminated by matching, in the reverse direction, the high frequency output impedance of the probe tip to the impedance of the coaxial cable that connects it to the probe. This impedance matching in the reverse direction, i.e. in the direction from the probe body back through the coaxial cable to the probe tip, dissipates the reverse signals due to coupling between physically close channels and reflection from the input capacitance of the probe amplifiers.

In the preferred embodiment up to nine separate probe channels are combined in a single hand-held probe body. Because the reverse signals are dissipated, the nine channels can be incorporated in a densely circuited package, such as an integrated circuit chip. Thus, the reverse impedance matching makes possible a probe in which multiple channels are packed into a package as small as an IC chip.

The high frequency output impedance of the probe tip is matched to the impedance of the coaxial cable by placing a resistor between the capacitive divider of the probe tip and the coaxial cable. The value of the shunt capacitance needs to be large enough to provide a high frequency ground to the impedance matching resistor over the required range of frequencies. Since the probe has a very high attenuation ration, preferably about 100:1, the series capacitance is small while the shunt capacitance is large. This allows the input capacitance of the probe to be small, preferably less than 1 picofarad, while the output impedance is matched to the coaxial cable at high frequencies.

The invention provides an analog voltage probe comprising: a plurality of probe channels, each channel comprising: a probe input, a probe amplifier circuit, a lead connecting the probe input to the probe amplifier circuit; and reverse signal reduction means for reducing the reverse signal in the probe channels. Preferably, the probe amplifier circuits are part of an integrated circuit, and each of the leads is a coaxial cable of from 50 ohms to 100 ohms impedance. Preferably, the reverse signal reduction means comprises a plurality of resistors, each of the resistors in series with each of the leads and high frequency ground. Preferably, each of the resistors has a value of between 98 and 102 ohms. Preferably, the reverse signal reduction means further comprises a capacitor in series with the resistor and the capacitor provides a high frequency connection to ground for the resistor. Preferably, the capacitor has a capacitance of 15 picofarads. Preferably, the analog voltage probe includes a high frequency input divider between the probe input and the amplifier, and the capacitor is an element of the high frequency input divider.

In another aspect the invention provides an analog voltage probe comprising: a plurality of probe channels each including a probe tip, a probe amplifier circuit having an input, and an electrical lead connecting the probe tip and the input; and reverse signal impedance matching means in the probe tip for matching the impedance of the electrical lead in the reverse direction. Preferably, the analog test probe further includes forward signal impedance matching means at the input of the amplifier circuit. Preferably, there are from two to a thousand of the probe channels.

In a further aspect, the invention provides an analog voltage probe comprising: an integrated circuit including a plurality of integrated circuit inputs; a plurality of probe inputs; a plurality of probe leads, each lead connecting one of the probe inputs and one of the integrated circuit inputs; and reverse signal reduction means for reducing the reverse signal in the leads. Preferably, the reverse signal reduction means comprises a resistor in series with each of the leads and high frequency ground, and a capacitor in series with the resistor, each of the leads, and ground. Preferably, the integrated circuit comprises a plurality of outputs and a multiplexer means for connecting any one of the integrated circuit inputs with the plurality of outputs.

The invention not only provides a hand-held voltage probe that can include many individual probe channels within a small hand-held probe body while maintaining high band width and high signal integrity, it also does this in a manner that allows the probe to be manufactured relatively inexpensively. Numerous other features, objects and advantages of the invention will become apparent from the following description when read in conjunction with the accompanying drawings.

DESCRIPTION OF THE PREFERRED EMBODIMENT

Figure 1:
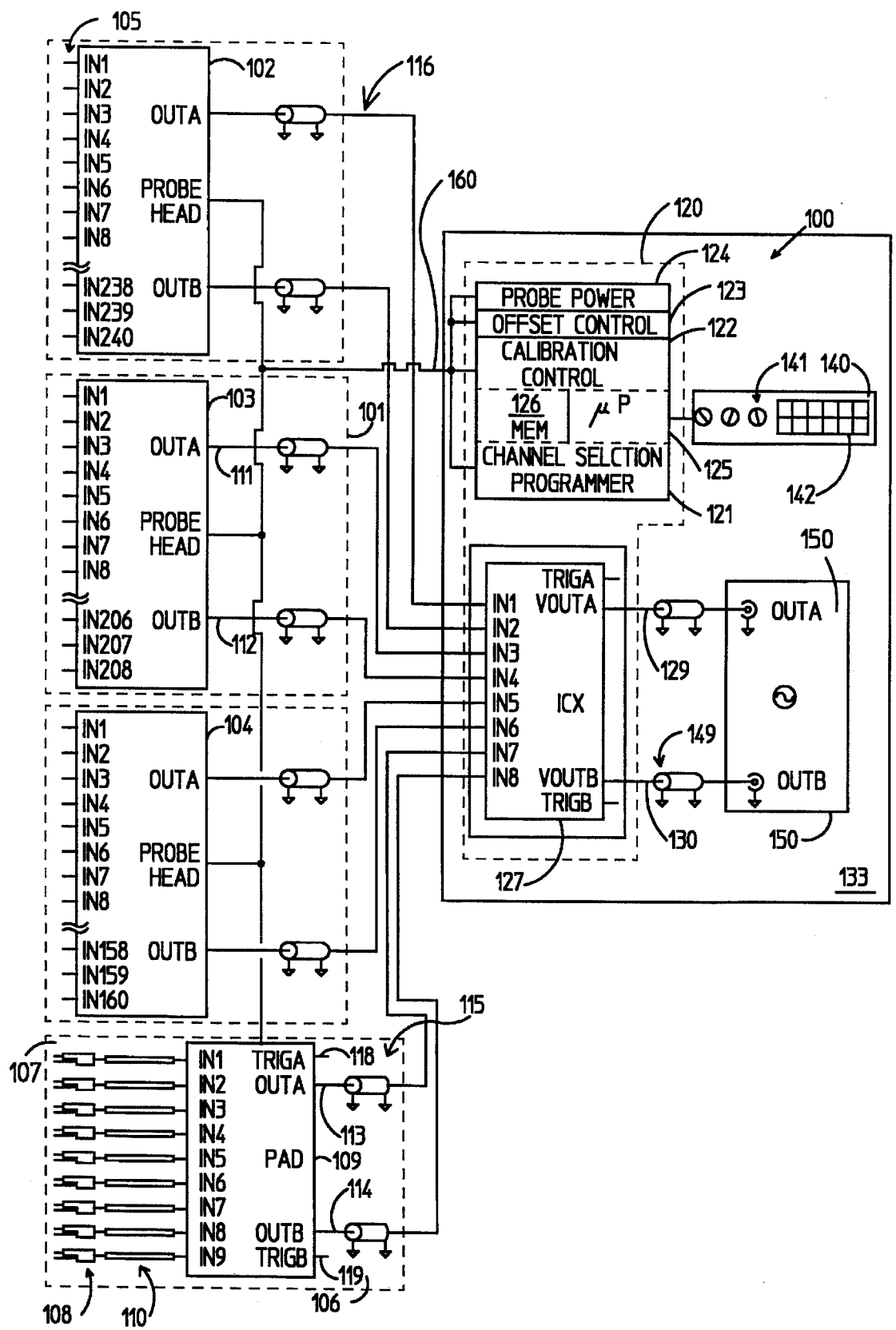
FIG. 1 is a block circuit diagram of the preferred embodiment of an electronic probe system according to the invention.

FIG. 1 shows the preferred embodiment of an analog voltage probe system 100 according to the invention. It should be understood that the specific system shown in the figures and described herein, is exemplary. That is, it is intended to show preferred examples of the invention so that those skilled in the art can fully understand and implement it. It is not intended to limit the invention to the specific examples described and shown.

In this disclosure, the term "electrically connected" when applied to two electrical elements, such as an input and an output, means that an electrical signal, such as a voltage, a current, an analog signal, or a digital signal, will pass from one element to the other. This is in distinction to a physical connection by electrical components. For example, an input and an output may be physically connected by wires, amplifiers, transistors, resistors and other electrical components, but no signal will pass from the input to the output because one or more of the switching or amplification components may be off. In this case, the input and output are not "electrically connected". In this disclosure "amplifier" means an electronic circuit that passes signals, usually changing the amplitude, without significant distortion, and includes 1:1 amplifiers as well as negative amplifiers, not just amplifiers with a positive gain.

Probe system 100 includes three plastic quad flat pack (PQFP) probes, such as 101, and a general purpose probe 106. Each PQFP 101 includes a probe head, such as 103, and two coaxial cables 115. Each of probe heads 102, 103, and 104 has a specific number of inputs 105 and is mechanically enclosed in a probe body (not shown) which probe body is designed to be easily held in one hand and easily mechanically coupled to a specific plastic quad flat pack (not shown). The probe inputs 105 of the probe heads 102–104 are designed to be easily electrically coupled to the inputs of the specified PQFP. For example, probe head 102 is designed to couple to a PQFP with 240 pins, probe head 103 is designed to couple to a PQFP with 208 pins, while probe head 104 is designed to couple to a PQFP having 160 pins. Each of the probe heads 102, 103 and 104 includes a multiplexer capable of connecting any one of its inputs 105 with any one or both of its outputs, such as 111 and 112.

The exemplary probe system 100 also includes a general purpose single point probe head 106, which includes nine probe tips 108, a circuit pod 109, and two coaxial cables 115. Each probe tip 108 includes an input 107 and is connected to pod 109 via a lead 110, which is preferably a 100 ohm coaxial cable. General purpose probe 106 is preferably used to probe circuits for which no specific probe head is available.

The probe system 100 has two outputs 129 and 130. Likewise most of the system components, such as pod 109, have two outputs, such as 113 and 114 for pod 109. In each case we shall refer to one output as the "A" output and the other as the "B" output. Pod 109 includes an integrated circuit 240 (FIG. 2) that includes a multiplexing amplifier 302 (FIG. 3) that can connect any of its probe tips 108 to either or both of its outputs 113 and 114. Each of the separate paths through the pod 109, or equivalently, through multipurpose probe 106 that a signal can follow from a selected one of the probe inputs 107 to a selected one of the probe outputs 113 and 114, defines a probe channel, such as 340 (FIG. 3). Thus pod 109, which includes nine inputs 107, and two outputs 113 and 114 includes at least eighteen possible probe channels. When one considers the probe system 100 as a whole, each of the channels 340 through multipurpose probe 106 can pass to either of two outputs 129 and 130 of probe system 100, which multiplies the possible channels by two. To simplify the discussion herein, we shall use the channel 340 through the multipurpose probe 106 as the exemplary channel, though we could also pick one of the more numerous channels through the system 100 as a whole, that is, from one of inputs 105, 107 to one of outputs 129, 130.

Probe system 100 also includes a printed circuit board (PCB) 120 which fits into a logic analyzer 133 designed to interface with the probe, which logic analyzer is sometimes referred to in the art as a "main frame". PCB 120 contains a channel selection programmer circuit 121, a calibration control circuit 122, an offset control circuit 123, and a probe power circuit 124, which circuits share a microprocessor 125 and its associated memory 126; e.g. the channel selection programmer 121 includes memory 126 and microprocessor 125 in that channel selection software stored in memory 126 is used by microprocessor 125 to provide output signals that cause the programmer 121 to output data on line 160 to program latches 390 (FIG. 3 in the probe heads 102-104 and the pod 109. Microprocessor 125 and memory 126 are not on PCB 120 but are in main frame 133, and thus are shown with a dotted line around them. Channel selection programmer 121 preferably includes a field programmable gate array which is programmed to interact with microprocessor 125 and memory 126 to output a series of data bits to shift registers comprising the latches 390 (FIG. 3). This data controls the latches to determine which probe tip 108 or probe tips are connected to outputs 113 and 114.

PCB 120 also includes a second level multiplexer 127. Multiplexer 127 is implemented as an integrated circuit (IC) die on PCB 120, and is capable of connecting any of its 8 inputs to either or both of its outputs, 129 and 130. In addition, probe system 100 includes means 140 for inputting control signals, such as for programming second level multiplexer 127, probe heads 102–104, and pod 109. In the preferred embodiment, means 140 includes dials 141 and a keyboard 142, though almost any mechanism for generating electrical control signals may be used. In the preferred embodiment, the dials 141 are located on the front of the logic analyzer 133, and the keyboard is a computer work station keyboard; however, for simplicity they are shown on a common control signal input means 140.

The outputs 113, 114, of pod 109 are connected to second level multiplexer 127 via standard 50 ohm coaxial cables 115. The outputs 129, 130 of second level multiplexer 127 are connectable to a test instrument, such as an oscilloscope 150, via 50 ohm microstrip "coax's" 149. Control PCB 120 is connected to probe heads 102–104, pod 109, and second level multiplexer 127 via a multiwire cable 160. Multiwire cable 160 includes conventional power lines, a serial interface including data and clock lines, and other lines. In the preferred embodiment, coaxial cables 115 and wires 160 are bound together in a single cable.

Pod 109 and second level multiplexer 127 are also capable of multiplexing their inputs to two trigger outputs, such as 118 and 119, though, in the embodiment shown, these are not used.

An analog electronic probe according to the invention may take many other forms than that shown in FIG. 1. The specific embodiment shown has been chosen for its usefulness in illustrating in one system several of the possibilities for implementing the invention, i.e., pod 109 as well as the probe system 100 as a whole. The present invention resides principally in the general purpose probe 106, and thus only this portion of the system 100 will be described in detail. The other parts of the probe system are described in detail in copending United States Patent application serial No. (PDN 1094751), which is incorporated herein by reference.

Figure 2:
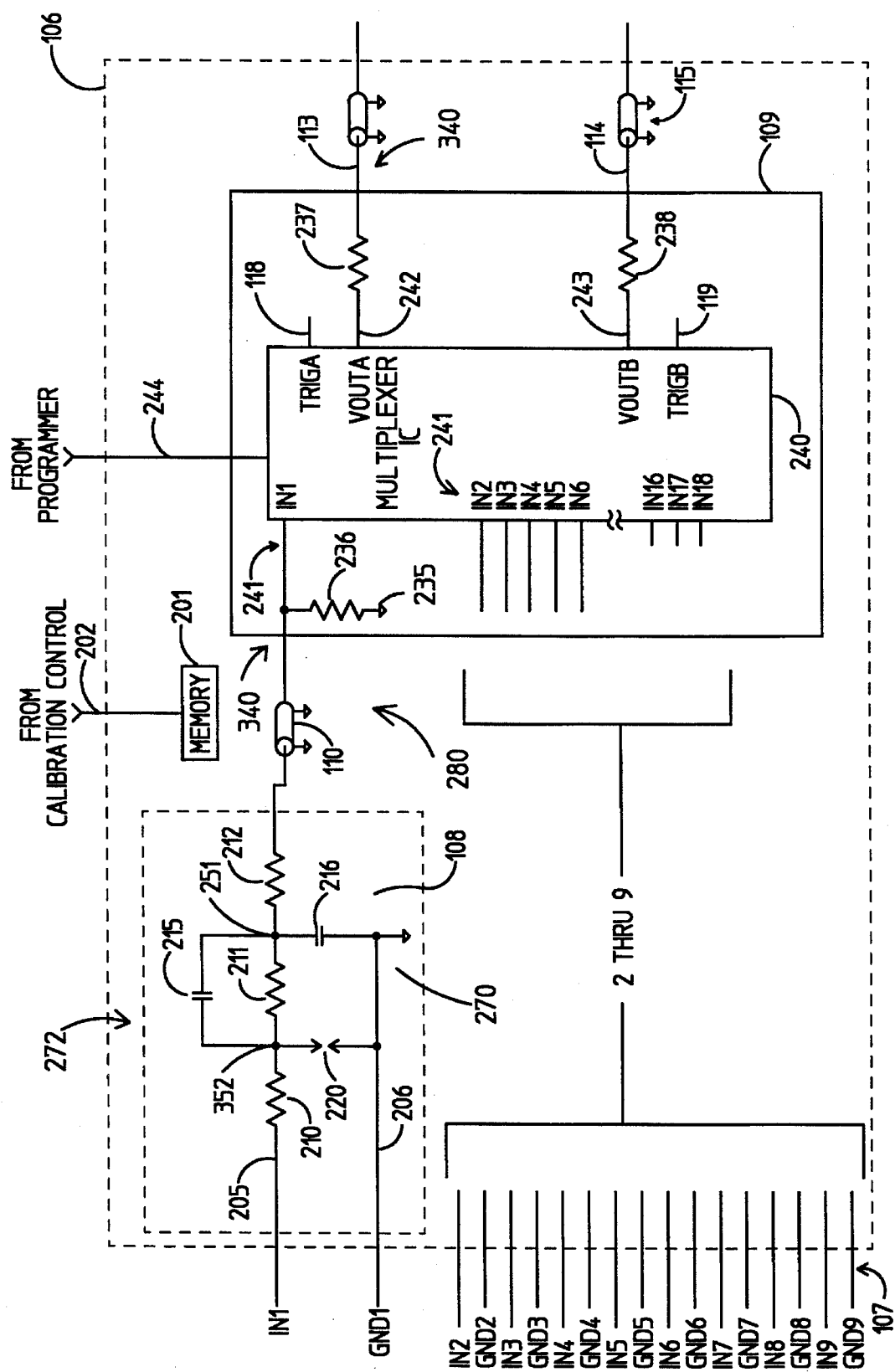
FIG. 2 is a partially block circuit diagram of a probe head for nine general purpose single point probes of the probe system of FIG. 1.
Figure 3:
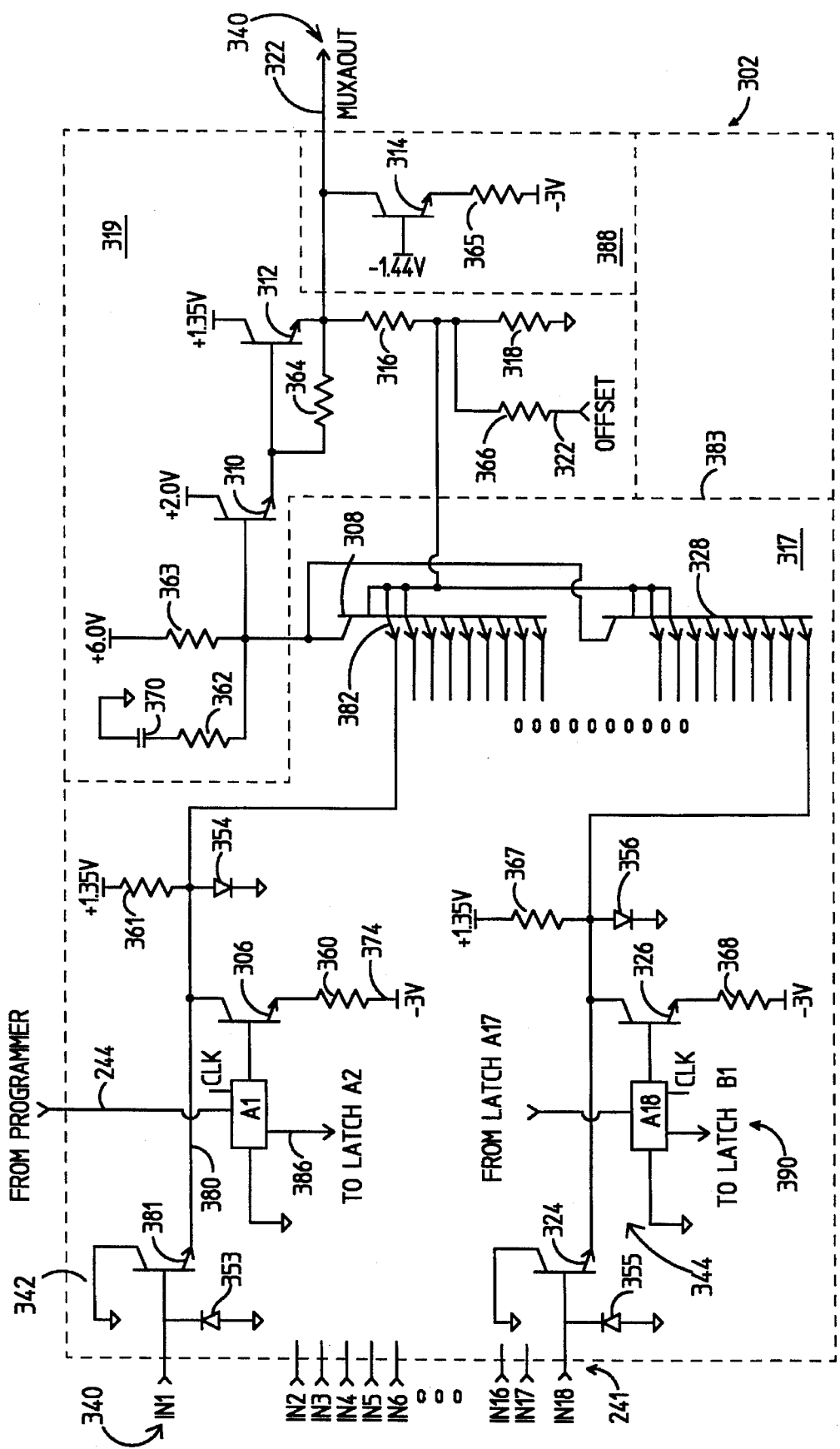
FIG. 3 is a detailed circuit diagram of the multiplexing amplifier in the probe head of FIG. 2.

Turning to FIG. 2, general purpose probe 106 is shown. Probe 106 includes memory 201, nine probe tips 108, lead 110, probe circuit pod 109, and two of coaxial cables 115. For simplicity, only one probe tip 108 and its associated coaxial cable 110 is shown. The other nine are indicated by a bracket labeled "2 through 9". Each probe tip 108 includes an input 107 including an input signal line 205 and a ground line 206. Each probe tip also includes tip resistor 210, divider resistor 211, output impedance matching resistor 212, series divider capacitor 215, shunt divider capacitor 216, and spark gap 220. Circuit pod 109 includes resistors 236, 237, and 238, and custom integrated circuit (IC) multiplexer chip 240.

Input 205 is connected to lead 110 through resistors 210, 211, and 212 in series. Capacitor 215 is connected in parallel with resistor 211. One side of capacitor 216 is connected to the node 251 between resistors 211 and 212, and the other side is connected to ground. Spark gap 220 is placed between the node 252 between resistors 210 and 211 and ground. Memory 201 is connected to the calibration control module 122 via cable 202 which is part of cable bundle 160. Multiplexer IC 240 has eighteen inputs 241, though in the embodiment shown, only 9 are used. Multiplexer IC 240 can connect any one of its eighteen inputs 241 with any one or both of its outputs. Thus, there are 36 possible probe channels, such as 340, in the multiplexer 240.

The embodiment shown illustrates but one example of the probe 109 configuration. In this embodiment, any number of the inputs 241 could be used. This permits the integrated circuit 240 to be used in a general purpose probe with any number of probe tips, from one to eighteen, greatly reducing the cost as compared to the case where a custom chip would be made for each different general purpose probe. In addition, the custom chip could be designed with a lesser or greater number of inputs and corresponding channels. Based on the integrated circuit technology currently available, anywhere from two to about a thousand inputs and corresponding channels could be incorporated in an integrated circuit.

Integrated circuit 240 has four outputs 118, 119, 242, and 243, the first two of which are trigger outputs, and the latter two of which are analog signal outputs. Lead 110 connects probe tip 108 and the In1 input of multiplexer IC 240. Similarly other leads 110 connect the other probe tips to inputs In2 through In9 of multiplexer IC 240. Each of these inputs is connected to ground through a terminal resistor 236 that matches the impedance of the coaxial cable 110. Note that in this disclosure, grounds are shown as an inverted triangle as at 235. Multiplexer IC output 242 is connected to one of coaxial cables 115 through resistor 237, while multiplexer IC output 243 is connected to another one of coaxial cables 115 through resistor 243. Line 244 is the data connection from programmer 121 that goes to the shift register latches 390 (FIG. 3) in the multiplexer amplifier 302 in IC 240 and is part of cable bundle 160.

Resistors 210, 211, 212, 236, 242 and 243 preferably have the values 200 ohms, 9.6 Kohms, 100 ohms, 100 ohms, 50 ohms, and 50 ohms, respectively. Leads 110 are preferably 100 ohm coaxial cables. Resistor 212 is selected to match the impedance of lead 100 for signals in the reverse direction. Preferably, output impedance matching resistor 212 is between 98 and 102 ohms for a 100 ohm coaxial cable 110. If lead 110 is a coaxial cable of a different rating, such as 50 ohm coaxial cable, then the resistor 212 will be within a few percent of the cable rating, such as between 49 and 51 ohms for a lead 110 of 50 ohms. Capacitors 215 and 216 are preferably 400 femtofarads and 15 picofarads, respectively. Preferably, capacitor 216 is in the range of between 10 picofarads and 30 picofarads. The breakdown voltage of spark gap 220 is preferably about 800 volts. All probe tip components can withstand electrostatic discharge (ESD) voltages up to the spark gap threshold voltage. It should be noted that because capacitor 216 is so large, at high frequencies the forward or input signal will divide between capacitor 215 and capacitor 216 and again divide between resistor 212 and the cable 110. Reverse signals that return up the cable 110 are absorbed by resistor 212 which, at high frequencies, is essentially connected to ground through capacitor 216. This is the circuit that primarily dissipates the reverse signals that come back from pod 109 through cable 110. That is, the circuit 270 including capacitor 216 and resistor 21 comprises a reverse signal reduction means for reducing the reverse signal in the probe channel 340. The circuit 272 comprising capacitor 215 and capacitor 216 comprises an input capacitive divider for the probe channel 340. Thus, capacitor 216 acts both as one element of the high frequency input divider 272 of the probe, i.e. the shunt element, for the forward signals, and also provides the high frequency ground for the reverse signals.

A detailed circuit diagram of the multiplexer amplifier (muxamp) circuit 302 within IC 240 is shown in FIG. 3. Muxamp 302 includes eighteen inputs 241, transistors 304, 306, 308, 310, 312, 314, 324, 326, and 328, latches A1 through A18, diodes 353 through 356, resistors 316, 318, and 360 through 368, capacitor 370, and output 322. Preferably, all transistors in this circuit and in other circuits of this disclosure are bipolar NPN transistors. Transistors 308 and 328 are nine emitter transistors. The latches A1 and A18 may be any device having an output that may be latched in either of two states: a "low" or logic "0" state that in this embodiment is preferably about −3.0 volts, and a "high" or logic "1" state that in this embodiment is about +0.0 volts.

The latches are labeled with designations, such as A1 and A18, that indicate their relative position in the circuit and in the shift register 390. The "A" or "B" indicates whether the latch is an "A" channel, that is a channel that connects to the "A" output 242 or a "B" channel, that is, a channel that connects to the "B" output 243. The number indicates the order of the latch in the channel, e.g. latch A18 indicates the 18th "A" channel latch. Preferably resistors 360 through 368 have the values 125 ohms, 2 Kohms, 500 ohms, 2.3 Kohms, 1 Kohm, 200 ohms, 1.8 Kohms, 2 Kohms, and 125 Kohms. Capacitor 370 preferably has a value of 0.2 picofarads.

Muxamp 302 includes an 18:1 multiplexer 317, which is the circuit to the left of the dotted line 383, a feedback amplifier 319 for driving the signal selected by multiplexer 317 out of the muxamp, and a current source circuit 388 for biasing the output 322. In the implementation shown in FIG. 3, the feedback circuit for amplifier 319 actually passes through transistors 308 and 328 which are part of multiplexer 317. Multiplexer 317 is essentially eighteen amplifiers, such as 342, which can be selectively activated via latches 390. Each differential amplifier, such as 342, comprises two transistors, such as 304 and 308, with their emitters, such as 381 and 382 connected. We shall refer to these connected emitters as an "emitter pair". In the implementation shown, transistor 308 is a nine-emitter transistor, so it acts as the second transistor for the first nine of the amplifiers, while a second nine-emitter transistor 328 acts as the second transistor for the last nine of the amplifiers. The amplifier circuit 342, e.g. the circuit shown between input In1 and the first emitter of transistor 308, is repeated 18 times in muxamp 302, though only the first and last, i.e. the amplifier circuits 342 and 344, respectively, for inputs In1 and In18, are shown. As will be clear from the following, each of these amplifier circuits, plus each of the multipurpose probe outputs 113 and 114 defines a separate multipurpose probe 106 channel. Since the In1 input of muxamp 302 inputs 241 connects to the In1 input of the probe 106 and since the MuxAout output 322 of muxamp 302 connects to the multiplexer IC 242, the In1 input and the output 322 define a channel 340 through the muxamp 302 and the multiplexer 240.

The In1 input is connected to the base of transistor 304 and is also grounded through diode 353, which has its anode connected to ground. In this configuration, diode 353 protects against excessive negative voltages applied to the input In1. Diode 353 begins to turn on when the negative voltage on the input reaches about minus 0.7 volts. Protection against positive voltage excursions is provided by the collector/base junction of transistor 304, which, as known in the art, is essentially a diode. The collector of transistor 304 is connected to ground.

Note that in this disclosure voltage sources are shown as a line with the voltage written next to it, as at 374. The probe power supply 124 (FIG. 1) provides voltages of +6.0 volts, +1.35 volts, and –3.0 volts. IC chip 240 also has an on-chip circuit that generates –1.44 volts. Other intermediate voltages are obtained in a conventional manner by placing one or more diodes that attenuate the voltage between the line carrying the appropriate voltage from the power supply 124 and the portion of the circuit where the intermediate power source is shown.

The separate biasing of each channel, i.e. the separate connection of each channel to the power supply through the collector of the first transistors, such as 381, prevents adjacent channels from "talking" via the power supply. Thus, it provides isolation when the channel is off. As mentioned above, the emitter of transistor 304 is connected to the first emitter of transistor 308. The node 380 defined by the latter connection is connected to the collector of transistor 306. The base of transistor 306 is connected to the output of latch A1. Line 244 applies the shift register data signal to latch A1, which signal is passed to the next latch via line 386. A clock signal is also applied to clock the latch, as is known in the art. Latch A1 is also referenced to ground separately from the other latches in the multiplexer to produce an accurate, repeatable bias lever for the control switch comprising latch A1 and transistor 306. The emitter of transistor 306 is connected to the –3.0 volt voltage source through resistor 360. When latch A1 goes high it turns transistor 306 on, which provides a current source for the amplifier circuit passing through the first emitter of transistor 308 and comprising transistors 304 and 308, activating this amplifier and thus turning on channel 1 of the "A" multiplexer 317. This electrically connects the input associated with this channel to the output 322 of muxamp 302, the output 113 of multipurpose probe 106, and to the selected output 129 or 130 of probe system 100.

Node 380 is also connected to ground through diode 354, the cathode of which is connected to ground, and is connected to the +1.35 volt voltage supply through resistor 361. The combination of diode 354 tied to ground and the connection to the +1.35 voltage source through resistor 361 forces node 380, and the emitter pair 381 and 382 to which node 380 connects, to a controlled shut-off voltage when the channel is not connected, and further assists in reducing coupling between the channels. Preferably the controlled shut-off voltage is about 0.75 volts, which reverse biases the base/emitter junctions of transistors 304 and 308 when latch A1 is off.

The circuit between input In18 and the last emitter of transistor 328 is identical in structure and function as the circuit between In1 and the first emitter of transistor 306, except that the latch A18 is in a different position in the shift register of latches and thus its function will be determined by the bit in that position. This latter circuit, together with output 322, or equivalently, outputs 242 and 113, defines the eighteenth channel associated with "A" section. Likewise each of the other circuits between the other inputs In2 through In17 and the corresponding emitter define a probe channel.

The collectors of transistors 308 and 328 are connected to the base of transistor 310, to a +6.0 volt power source through resistor 363, and to ground through resistor 362 and capacitor 370 connected in series. The collector of transistor 310 is connected to a +2.0 volt power source, and its emitter is connected to the base of transistor 312 and the muxamp output 322 through resistor 364. The collector of transistor 312 is connected to the +1.35 power source and its emitter is connected to output 322. The output 322 is also connected to the bases of transistors 308 and 328 through resistor 316 to provide the feedback. The bases of transistors 308 and 328 are also connected to ground through resistor 578 and to the offset voltage input 392 through resistor 366. The offset voltage is applied from calibration control module 122 (FIG. 1) and provides a means for trimming the muxamp 302 circuit for calibration purposes.

Output 322 also is connected to the collector of transistor 314. The base of transistor 314 is connected to a –1.44 volt power source and its emitter is connected to the –3.0 volt power source through resistor 365. This circuit provides a bias for transistors 310 and 312 at a value that permits transistors to operate as desired.

The muxamp output 322 connects to IC output 242 through other circuitry (not shown) which adjusts the gain of the IC 240, which circuitry is not pertinent to the present invention, and thus will not be discussed herein. Likewise there is an identical muxamp that connects between the inputs 241 and the output 243, which muxamp likewise contains eighteen emitter pair amplifiers which define eighteen "B" channels.

The implementation of the probe circuitry on the multiplexer IC chip 240 is a key factor in obtaining the density of circuitry to permit eighteen or more probe channels, each with high signal integrity and high band width. However, this implementation makes it difficult, if not impossible to properly terminate the cable 110 within the circuitry 240, which leads to signal reflections from the IC 240 back through the cable 110. Further the small physical size of IC 240 makes it practically impossible to eliminate coupling between the inputs 241, since the inputs 241 are necessarily so close together. This results in reverse coupling between the inputs; that is, some of the signal from one input in the forward direction, i.e., the direction from the probe tip 108 to the multiplexer IC 240, will couple to the adjacent inputs in the reverse direction, i.e. the direction from the multiplexer IC 240 to the probe tip 108. It is a feature of the invention that, with respect to signals in the inverse direction, capacitor 216 and resistor 212 together match the output impedance of the probe tip 108 to the input impedance of cable 110. This permits any signal that reflects from the cable/IC interface and which couples from adjacent channels to dissipate in resistor 212 and capacitor 216. If this reverse signal is not absorbed, it would reflect from the distal end of probe input 205, and return into the probe channel 280 associated with the first probe tip 108, and seriously degrade the performance of the probe 106. Thus, by a judicious but simple design that causes the reverse signal to be removed from the circuit in the probe tip, the use of an integrated circuit 240 to implement the probe becomes possible, and a seemingly insurmountable problem is solved.

There has been described a novel analog signal test probe which provides multi-channel capability with high signal integrity and band width, and which has many other advantages. It is evident that, now that the invention has been fully disclosed, those skilled in the art may now make numerous uses and modifications of the specific embodiment described, without departing from the inventive concepts. For example, now that it is seen that the removal of the reverse signals enables a dense array of probe channels to be practical, other designs to remove the reverse signals may also be used. The invention may be incorporated with any probe design in which it is useful. Or equivalent components or circuits can be substituted for the various components and circuits described. Additional features may be added. A greater or lesser number of parts may be used. Consequently, the invention is to be construed as embracing each and every novel feature and novel combination of features present in and/or possessed by the test probe described.

What is claimed is:

1. An analog voltage probe comprising: a passive probe tip, a probe amplifier circuit, a lead connecting said passive probe tip to said probe amplifier circuit; and reverse signal reduction means for reducing the reverse signal in the portion of said voltage probe including said lead and said passive probe tip.

2. An analog voltage probe as in claim 1 wherein said probe amplifier circuit is part of an integrated circuit.

3. An analog voltage probe as in claim 1 wherein said lead is a coaxial cable.

4. An analog voltage probe as in claim 3 wherein said coaxial cable has an impedance of from 50 ohms to 100 ohms.

5. An analog voltage probe as in claim 1 and further including a high frequency ground, and wherein said reverse signal reduction means comprises a resistor in series with said lead and high frequency ground.

6. An analog voltage probe as in claim 5 wherein said resistor has a value of from 98 to 102 ohms.

7. An analog voltage probe as in claim 5 wherein said reverse signal reduction means comprises a capacitor in series with said resistor, and wherein said capacitor provides a high frequency connection to ground for said resistor.

8. An analog voltage probe as in claim 7 wherein said capacitor has a capacitance of from 10 picofarads to 30 picofarads.

9. An analog voltage probe as in claim 8 wherein said capacitor has a capacitance of 15 picofarads.

10. An analog voltage probe as in claim 7 and further including a high frequency input divider between said probe input and said amplifier, and wherein said capacitor is an element of said high frequency input divider.

11. An analog voltage probe comprising: a plurality of probe channels, each channel comprising: a passive probe tip, a probe amplifier circuit, a lead connecting said passive probe input to said probe amplifier circuit; and reverse signal reduction means for reducing the reverse signal in the portion of said probe channels including said probe tip and said lead.

12. An analog test probe as in claim 11 and further including forward signal impedance matching means electrically connected to said lead.

13. An analog voltage probe as in claim 11 wherein said electrical lead is a coaxial cable.

14. An analog voltage probe as in claim 12 wherein said coaxial cable is a 100 ohm coaxial cable.

15. An analog voltage probe as in claim 11 wherein said probe amplifiers are part of an integrated circuit.

16. An analog voltage probe as in claim 11 wherein there are from two to a thousand of said probe channels.

17. An analog voltage probe comprising:
   an integrated circuit including a plurality of integrated circuit inputs;
   a plurality of passive probe tips;
   a plurality of probe leads, each lead connecting one of said passive probe tips and one of said integrated circuit inputs; and
   reverse signal reduction means for reducing the reverse signal in the portion of said voltage probe including said probe tips and said leads.

18. An analog voltage probe as in claim 17 and further including a high frequency ground, and wherein said reverse signal reduction means comprises a resistor in series with each of said leads and said high frequency ground.

19. An analog voltage probe as in claim 18 wherein said reverse signal reduction means comprises a capacitor in series with said resistor, each of said leads, and said ground.

20. An analog voltage probe as in claim 17 wherein said integrated circuit comprises a plurality of outputs and a multiplexer means for connecting any one of said integrated circuit inputs with said plurality of outputs.

* * * * *